United States Patent
Song

(10) Patent No.: US 7,656,722 B2
(45) Date of Patent: Feb. 2, 2010

(54) SEMICONDUCTOR MEMORY APPARATUS INCLUDING SYNCHRONOUS DELAY CIRCUIT UNIT

(75) Inventor: Seong Hwi Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 177 days.

(21) Appl. No.: 11/878,908

(22) Filed: Jul. 27, 2007

(65) Prior Publication Data

US 2008/0253204 A1 Oct. 16, 2008

(30) Foreign Application Priority Data

Apr. 12, 2007 (KR) .................. 10-2007-0035826

(51) Int. Cl.
*G11C 7/00* (2006.01)
(52) U.S. Cl. .................. 365/189.16; 365/193; 365/194; 365/233.1
(58) Field of Classification Search ............ 365/189.16, 365/193, 194, 233.1
See application file for complete search history.

(56) References Cited

U.S. PATENT DOCUMENTS

| | | | |
|---|---|---|---|
| 6,807,108 B2 * | 10/2004 | Maruyama et al. | 365/189.05 |
| 6,836,165 B2 | 12/2004 | Goto et al. | |
| 6,982,923 B2 | 1/2006 | Ootsuki | |
| 7,088,625 B2 * | 8/2006 | Merritt et al. | 365/189.05 |
| 2005/0254307 A1 | 11/2005 | Dietrich et al. | |
| 2007/0073982 A1 * | 3/2007 | Kim et al. | 711/149 |
| 2008/0002491 A1 * | 1/2008 | Ku et al. | 365/201 |

FOREIGN PATENT DOCUMENTS

| | | |
|---|---|---|
| KR | 10-0080510 | 12/1994 |
| KR | 100154724 | 7/1998 |
| KR | 1020030002228 | 1/2003 |
| KR | 1020060027057 | 3/2008 |
| WO | WO-00/13184 | 3/2000 |

\* cited by examiner

*Primary Examiner*—Hoai V Ho
(74) *Attorney, Agent, or Firm*—Venable LLP; Jeffri A. Kaminski

(57) ABSTRACT

A semiconductor memory apparatus includes a write driver that receives data transmitted through an input/output line, and a synchronous delay circuit unit that generates an enable signal so as to allow the data transmitted through the input/output line to be supplied to the write driver.

12 Claims, 4 Drawing Sheets

SEMICONDUCTOR MEMORY APPARATUS INCLUDING SYNCHRONOUS DELAY CIRCUIT UNIT

CROSS-REFERENCE TO RELATED PATENT APPLICATION

This application claims the benefit of Korean Patent Application No. 10-2007-0035826, filed on Apr. 12, 2007, in the Korean Intellectual Property Office, the disclosure of which is incorporated herein in its entirety by reference.

BACKGROUND OF THE INVENTION

1. Technical Field

The present invention relates to semiconductor memory apparatuses, and more particularly, to a semiconductor memory apparatus including a write driver.

2. Related Art

In general, a semiconductor memory apparatus repeats a read/write operation. The read operation is an operation that outputs data stored in a selected memory cell to the outside of the semiconductor memory apparatus, and the write operation is an operation that stores data input from the outside of the semiconductor memory apparatus in to the selected memory cell.

Since a data input/output speed of the semiconductor memory apparatus is an important element that determines an operation speed of a system to which the semiconductor memory apparatus is applied, a technology for improving the operation speed of the semiconductor memory apparatus has been researched.

In order to improve the operation speed of the semiconductor memory apparatus, a synchronous DRAM (SDRAM) that controls internal circuits in synchronization with a clock signal generated from the outside of the synchronous DRAM has been developed.

The synchronous DRAM may be classified into a single data rate SDRAM (hereinafter, referred to as SDR SDRAM) and a double data rate SDRAM (hereinafter, DDR SDRAM). In the SDR SDRAM, one data is input or output during one cycle of an external clock signal in response to a rising edge or a falling edge of the external clock signal. Meanwhile, in the DDR SDRAM, two data are input or output during one cycle of an external clock signal in response to both a rising edge and a falling edge of the external clock signal. Thus, a bandwidth of the DDR SDRAM may be at a maximum two times wider than a bandwidth of the SDR SDRAM.

As shown in FIG. 1, in a general DDR2 SDRAM, a column active signal CACTV and a data input pulse DINCLKP are generated after two clock cycles which start when inputting a clock signal CLK including a write command WT. Data is loaded to a GIO (global input/output) line in synchronization with a rising edge of the data input pulse DINCLKP.

The write driver receives the data that is stored in the GIO line in response to the column active signal CACTV. At this time, a predetermined amount of delay time is required to receive the data loaded to the GIO line, and the delay time is ensured by a general delay member, for example, a circuit member that includes a plurality of inverters and RC elements. That is, the write driver is supplied with a bank write enable signal BWEN that adjusts the amount of time needed to receive the data loaded to the GIO line by the delay member. Specifically, when the bank write enable signal BWEN is at a high level, the write driver receives the data from the GIO line, and when the bank write enable signal BWEN is at a low level, the write driver stores the data loaded to the GIO line in a latch circuit that is included in the write driver.

Thus, in order to securely recognize the data from the GIO line, it is preferable to allow a high pulse interval of the bank write enable signal BWEN to be located at the center of a pulsing interval (H or L) of the signal from the GIO line. In the related art, the number of components that constitute a delay member is adjusted such that a pulsing interval of the bank write enable signal BWEN is located at the center of the high or low pulsing interval of the signal from the GIO line.

However, in the case of a DDR2 SDRAM that has a memory capacity of 1G byte, the length of the GIO line is about 15000 μm because the DDR2 SDRAM has an 8-bank structure. When the length of the GIO line is increased, a resistance value of the GIO line is increased. Therefore, a parasitic RC delay time is generated, which decreases a data transmission rate. For this reason, the bank write enable signal BWEN is delayed for a predetermined time longer than a set delay time. As a result, since the bank write enable signal BWEN is not generated at a proper timing, an error may occur when the write driver receives the data.

Further, the general delay member is composed of a delay circuit that includes a plurality of inverters, a resistor, and a capacitor, and transistors constituting the inverters, the resistor, and the capacitor may be affected by a voltage, a temperature, and a frequency. That is, in the delay member that includes the transistors, the resistor, and the capacitor that are normally affected by the outside environment, when the power and voltage are increased, a delay time is decreased, and when the power and voltage are decreased, the delay time is increased.

Therefore, in the bank write enable signal BWEN whose pulse generating interval is determined by the delay member, the pulse generating interval may be changed due to the length of the GIO line, process variables, or the like. In the case of a low-voltage and high-frequency element such as the DDR2 SDRAM, the high pulse interval of the bank write enable signal BWEN may be generated outside the high pulse interval of the signal from the GIO line.

For this reason, it is difficult for the write driver according to the related art to securely receive the data loaded to the GIO line.

SUMMARY OF THE INVENTION

An embodiment of the present invention provides a semiconductor memory apparatus to prevent a data writing error.

Another embodiment of the present invention provides a semiconductor memory apparatus that is capable of rarely being affected by an external environment and generating a signal that allows data to be received with an accurate timing.

An embodiment of the present invention provides a semiconductor memory apparatus including a write driver that receives data loaded to an input/output line, and a synchronous delay circuit unit that generates an enable signal so as to transmit the data loaded to the input/output line to the write driver.

The enable signal may adjust a timing of transmitting the data input to the input/output line to the write driver. The enable signal may be generated in synchronization with a column active signal. The enable signal may be generated in synchronization with a falling edge of the column active signal.

The enable signal may be generated in synchronization with a data input clock. The enable signal may be generated in synchronization with a falling edge of the data input clock.

The synchronous delay circuit unit may be a pulse generator.

The write driver may include a data input unit that receives data in response to the input/output line, a selecting unit that determines driving of the write driver, and a buffering unit that buffers an output signal of the data input unit.

The data is stored in the input/output line in synchronization with the data input clock.

Another embodiment of the present invention provides a semiconductor memory apparatus including an address buffer that generates a data input clock pulse after a predetermined time which starts when a clock signal including a write command is generated, a data input/output member that inputs data to an input/output line in response to the data input clock pulse, and a write driver that receives the data loaded to the input/output line. The write driver includes a synchronous delay circuit unit that generates an enable signal that adjusts a timing of when receiving the data supplied from the input/output line.

The data input/output member may include a pipe register that aligns data stored in a plurality of memory cells that constitute each of the banks, a data aligner that aligns data input from the outside of the semiconductor memory apparatus in response to the data input clock pulse, and a data input/output buffer that exchanges the data with an external apparatus and supplies the data to the data aligner.

Another embodiment of the present invention provides a semiconductor memory apparatus including an address buffer that receives a data input clock pulse after a predetermined time which starts when a clock signal including a write command is generated and supplies a row active signal and a column active signal to a plurality of banks, a data input/output member that inputs data to an input/output line in response to the data input clock pulse, a write driver that receives the data loaded to the input/output line, and a pulse generator that generates an enable signal that determines a timing of supplying the data loaded to the input/output line to the write driver. The pulse generator receives the data input clock pulse or the column active signal.

DETAILED DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
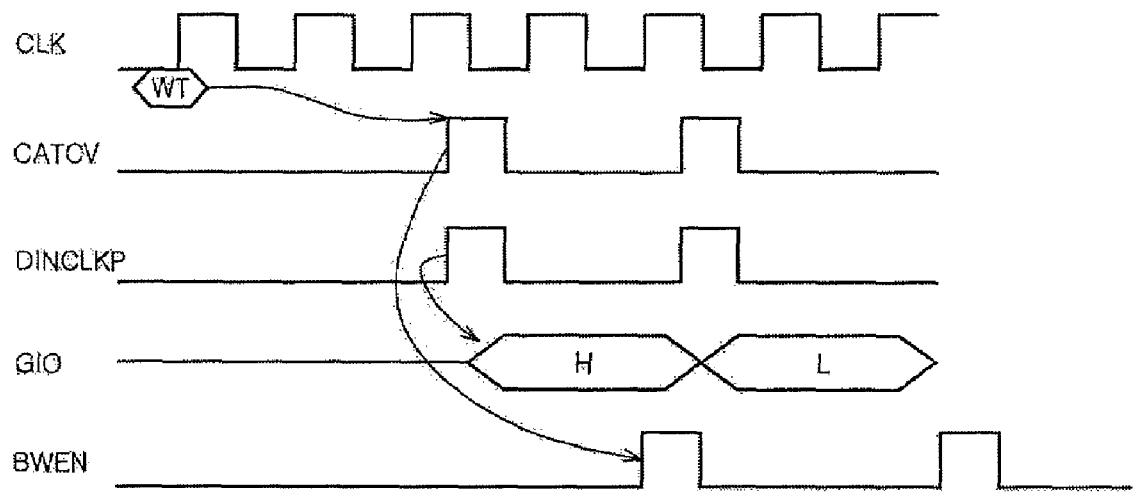
FIG. 1 is a timing diagram illustrating the operation of a semiconductor memory apparatus according to the related art.
Figure 2:
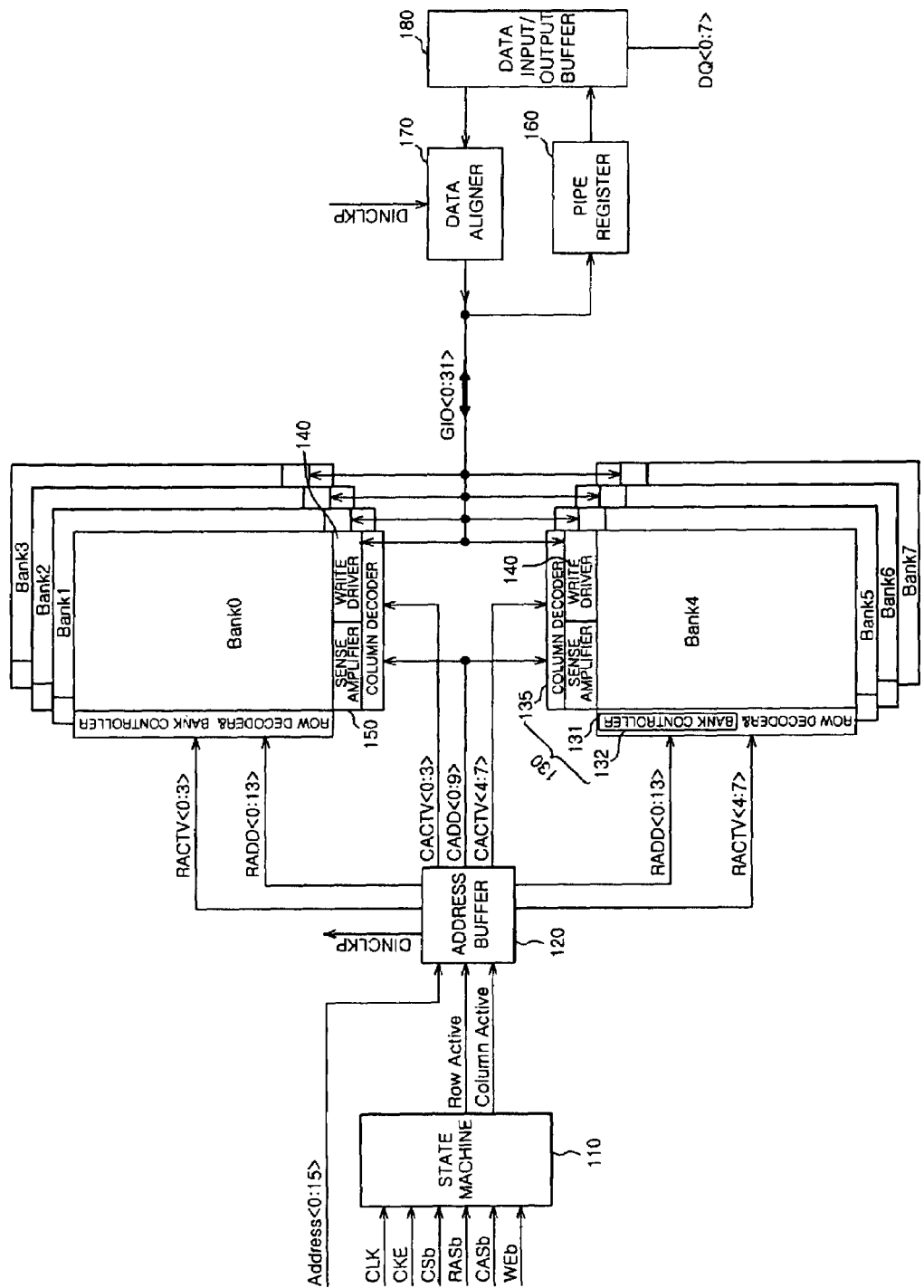
FIG. 2 is a block diagram illustrating a semiconductor memory apparatus according to an embodiment of the present invention.

Referring to FIG. 2, a semiconductor memory apparatus according to an embodiment of the present invention may include a state machine 110, an address buffer 120, a decoder 130, a write driver 140, a sense amplifier 150, a pipe register 160, a data aligner 170, and a data input/output buffer 180.

The state machine 110 may receive external commands CLK, CKE, CSb, RASb, CASb, and WEb for writing data in the semiconductor memory apparatus to generate a row active signal Row Active and a column active signal Column Active.

The address buffer 120 may receive an external address Address<0:15>, the row active signal Row Active, and the column active signal Column Active, to output a row address signal RADD<0:13>, row active signals RACTV<0:3> and RACTV<4:7> where addresses are designated, a column address signal CADD<0:9>, and column active signals CACTV<0:3> and CACTV<4:7> where addresses are designated for each of the banks 0 to 3 and 4 to 7, while generating a data input clock pulse DINCKLP for inputting data.

The decoder 130 may include a row decoder 131 and a column decoder 135. The decoder 130 may receive the row address signal RADD<0:13>, the row active signals RACTV<0:3> and RACTV<4:7> where addresses are designated, the column address signal CADD<0:9>, and the column active signals CACTV<0:3> and CACTV<4:7> where addresses are designated, and determines an address of a memory cell in each of the banks. The row decoder 131 may further include a bank controller 132 for controlling the internal operation of each bank.

The write driver 140 may receive data GIO<0:31> (hereinafter, referred to as GIO data) loaded to a GIO line according to the column active signals CACTV<0:3> and CACTV<4:7> where addresses are designated.

Figure 3:
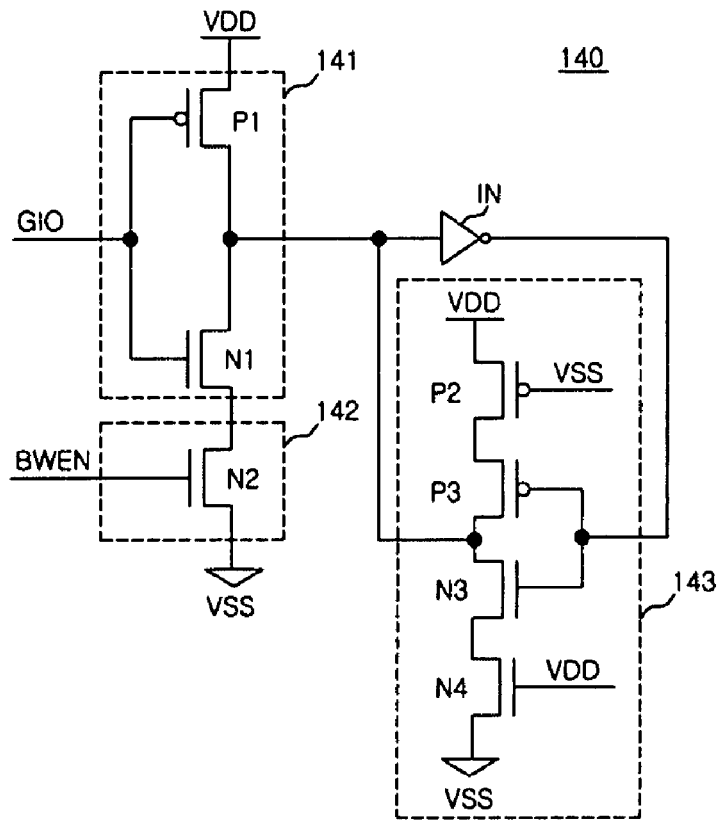
FIG. 3 is a circuit diagram illustrating an internal circuit of a write driver according to an embodiment of the present invention.

As shown in FIG. 3, the exemplary write driver 140 may include a data input unit 141, a bank selecting unit 142, a buffering unit 143, and an inverter IN. The data input unit 141 may include a first PMOS transistor P1 and a first NMOS transistor N1. The first PMOS transistor P1 includes a gate that receives data from the GIO line, a drain that is connected to a power supply voltage terminal VDD, and a source that is connected to the first NMOS transistor N1.

The bank selecting unit 142 may include a second NMOS transistor N2. The second NMOS transistor N2 includes a gate that receives a bank write enable signal BWEN, a drain that is connected to the first NMOS transistor N1, and a source that is connected to a ground terminal VSS.

The buffering unit 143 may include a second PMOS transistor P2, a third PMOS transistor P3, a third NMOS transistor N3, and a fourth NMOS transistor N4. The second PMOS transistor P2 includes a gate that is connected to the ground terminal VSS, a source that is connected to the power supply voltage terminal VDD, and a drain that is connected to the third PMOS transistor P3. The third PMOS transistor P3 includes a gate that receives an inverted signal of an output signal of the data input unit 141, a source that is connected to the second PMOS transistor P2, and a drain that is connected to the third NMOS transistor N3. The third NMOS transistor N3 includes a gate that receives the inverted signal of the output signal of the data input unit 141, a drain that is connected to the third PMOS transistor P3, and a source that is connected to the fourth NMOS transistor N4. The fourth NMOS transistor N4 includes a gate that is supplied with the power supply voltage VDD, a drain that is connected to the third NMOS transistor N3, and a source that is connected to the ground terminal VSS. In this case, the inverted signal of the output signal of the data input unit 141 provided by the third PMOS transistor P3 and the third NMOS transistor N3 may be obtained by the inverter IN.

In the exemplary write driver 140, the data GIO from the GIO line is transmitted to the data input unit 141 when the bank write enable signal BWEN is enabled at a high level. In accordance with a signal level of the data GIO from the GIO line, the data input unit 141 outputs a high or low level signal. For example, when the signal level of the data from the GIO line is at a low level, the data input unit 141 outputs a high level signal, and when the signal level of the data from the GIO line is at a high level, the data input unit 141 outputs a low level signal. The output signal of the data input unit 141 is input to the buffering unit 143 to be buffered, and the buffered signal is supplied to an output terminal of the data input unit 141.

Referring to FIG. 2 again, the sense amplifier 150 may amplify the data to transmit the data written in the memory cell to the outside of the semiconductor memory apparatus.

The pipe register 160 may align the GIO data GIO<0:31>, and the data aligner 170 may align external data DQ<0:7> that is input by the data input/output buffer 180. The data input/output buffer 180 may be located between the pipe register 160 and the data aligner 170. The data input/output buffer 180 may receive the external data DQ<0:7> and transmits it to the data aligner 170, and receives the data that has been aligned by the pipe register 160.

Figure 4:
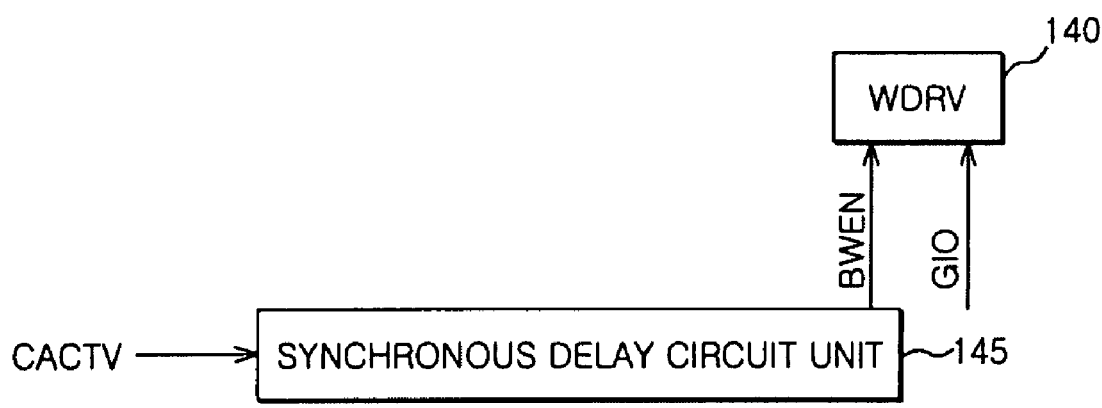
FIG. 4 is a diagram illustrating a synchronous delay circuit unit that supplies a bank write enable signal to a write driver according to an embodiment of the present invention.

As described above, the exemplary write driver 140 receives the GIO data in response to the bank write enable signal BWEN that is obtained by delaying the column active signals CACTV<0:3> and CACTV<4:7> where the addresses are designated for a predetermined time. In this embodiment, the bank write enable signal BWEN is generated by a synchronous delay circuit unit 145, as shown in FIG. 4. The synchronous delay circuit unit 145 may be designed such that the bank write enable signal BWEN is generated in synchronization with the column active signals CACTV<0:3> and CACTV<4:7> where the addresses are designated, preferably, falling edges of the column active signals CACTV<0:3> and CACTV<4:7>.

Figure 5:
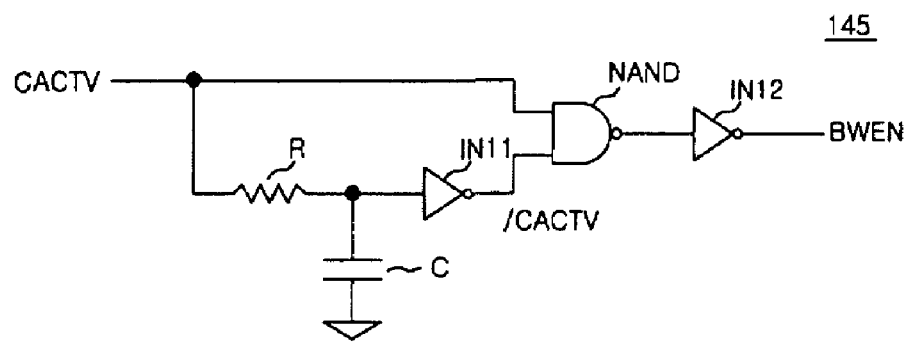
FIG. 5 is a circuit diagram illustrating an internal structure of a synchronous delay circuit unit according to an embodiment of the present invention.

A pulse generator may be used as the synchronous delay circuit unit 145 in this embodiment. As shown in FIG. 5, the pulse generator may include a resistor R, a capacitor C, a first inverter IN11, a NAND gate NAND, and a second inverter IN12.

In the example shown, the NAND gate NAND receives the column active signal CACTV where the address is designated and a column active signal /CACTV that has been delayed and inverted by the resistor R, the capacitor C, and the first inverter IN11, and outputs a high level signal when any one of the column active signal CACTV and the delayed and inverted column active signal /CACTV is at a low level. The second inverter IN12 inverts the output signal of the NAND gate NAND and outputs the bank write enable signal.

An example of the operation of the exemplary semiconductor memory apparatus according to the embodiment of the present invention that has the above-described structure will now be described.

Figure 6:
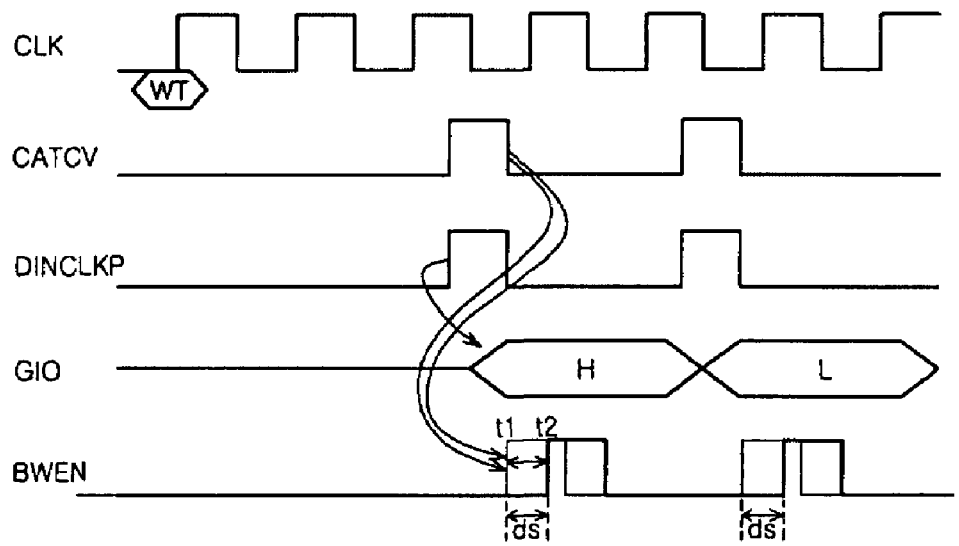
FIG. 6 is a timing diagram illustrating the operation of a semiconductor memory apparatus according to an embodiment of the present invention.

Referring to FIG. 6, after two clock cycles which starts when a clock signal CLK including a write command WT is input, a data input pulse DINCLKP and the column active signal CACTV where the address is designated are generated.

The data input from the outside of the semiconductor memory apparatus is loaded to the GIO (global input/output) line in synchronization with a rising edge of the data input pulse DINCLKP.

The synchronous delay circuit unit 145 of the write driver 140 is synchronized with a falling edge of the column active signal CACTV where the address is designated to generate the bank write enable signal BWEN. The delay member, which may be a delay member according to the related art, performs a delay operation at the rising edge of the column active signal CACTV. However, the synchronous delay circuit unit 145 according to this embodiment may be designed such that the bank write enable signal BWEN is generated in synchronization with a falling edge of the column active signal CACTV. Accordingly, it is possible to ensure a delay time that corresponds to a pulse width of the column active signal CACTV where the address is designated.

In this case, since the bank write enable signal BWEN generated by the synchronous delay circuit unit 145 is theoretically generated in synchronization with the falling edge of the column active signal CACTV, a pulse is generated during high and low enable intervals of the signal from the GIO line. However, the resistor R, the capacitor C, the inverters IN11 and IN12, and the NAND gate NAND, which form the synchronous delay circuit unit 145, generate a small amount of delay time, which causes a pulsing interval of the bank write enable signal BWEN to be located at about the center of the high and low enable intervals of the signal from the GIO line. Specifically, the pulsing interval of the bank write enable signal BWEN, which is generated in synchronization with the falling edge of the column active signal CACTV where the address is designated, may be located toward a pulse start interval t1 of the signal from the GIO line, as shown in FIG. 6. However, since the synchronous delay circuit unit 145 includes the resistor R, the capacitor C, and the transistors constituting the inverters IN11 and IN12 and the NAND gate that generate the delay time, the bank write enable signal BWEN may be generated substantially after the pulse start interval t1. At this time, the number of the respective components (for example, transistors) that form the synchronous delay circuit unit 145 according to this embodiment is smaller than that in an asynchronous delay circuit unit according to the related art, which generates the delayed time shorter than the delay time generated in the asynchronous delay circuit unit according to the related art. As a result, the bank write enable signal BWEN may be generated substantially in a range of an enable interval of the signal from the GIO line after a theoretical rising start time of the bank write enable signal BWEN, preferably, at about the center of the enable interval of the signal from the GIO line. As shown in FIG. 6, t2 indicates a point of time when the bank write enable signal BWEN is substantially generated, and ds indicates a delayed time by the synchronous delay circuit unit 145.

In this embodiment, the exemplary synchronous delay circuit unit 145 generates the bank write enable signal that allows the GIO data to be input to the write driver. Therefore, the delay time according to the length of the GIO line may not be considered, and the bank write enable signal is generated according to a data input interval of the signal from the GIO line, which prevents data from being erroneously input.

In this embodiment, the bank write enable signal is generated in synchronization with the column active signal where the address is designated. However, the bank write enable signal may be generated in synchronization with a falling edge of the data input clock pulse DINCLKP that has the same phase as the column active signal where the address is designated.

In this embodiment, the pulse generator has been used as the synchronous delay circuit unit. However, the present invention is not limited thereto, and it is possible to use essentially any device that can generate a signal in synchronization with a falling edge of a predetermined signal.

In this embodiment, the DDR2 SDRAM has been described as the semiconductor memory apparatus. However, the present invention is not limited thereto, and it is possible to use essentially any semiconductor memory apparatuses including the write driver.

According to the semiconductor memory apparatus including the synchronous delay circuit unit according to various embodiments of the present invention as described above, the bank write enable signal may be generated in synchronization with the column active signal (or data input clock pulse). Therefore, it is possible to ensure that the delayed time corresponds to the pulse width of the column active signal (or data input clock pulse). As a result, the write driver may supply the bank write enable signal at about the center of the write enable interval of the signal from the GIO line.

Further, since the pulsing operation of the bank write enable signal is performed at a proper timing, it is possible to prevent an error from occurring when the data is input to the GIO line.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory apparatus comprising:
 a write driver configured to receive data loaded to an input/output line; and
 a synchronous delay circuit unit configured to generate an enable signal so as to transmit the data loaded to the input/output line to the write driver, wherein the enable signal is generated in syncronization with a falling edge of a column active signal.

2. The semiconductor memory apparatus of claim 1,
 wherein the enable signal adjusts a timing of transmitting the data loaded to the input/output line to the write driver.

3. The semiconductor memory apparatus of claim 1,
 wherein the synchronous delay circuit unit comprises a pulse generator, receiving the column active signal as an input signal.

4. The semiconductor memory apparatus of claim 1,
 wherein the write driver includes:
 a data input unit that receives the data loaded to the input/output line and provides an output signal;
 a selecting unit that determines driving of the write driver; and
 a buffering unit that buffers the output signal of the data input unit.

5. A semiconductor memory apparatus comprising:
 an address buffer that generates a data input clock pulse after a predetermined time which starts when a clock signal including a write command is generated;
 a data input/output member that loads data to an input/output line in response to the data input clock pulse; and
 a write driver that receives the data loaded to the input/output line,
 wherein the write driver includes a synchronous delay circuit unit that generates an enable signal that adjusts a timing of receiving the data supplied from the input/output line, wherein the enable signal is generated in syncronization with a falling edge of a column active signal.

6. The semiconductor memory apparatus of claim 5,
 wherein the write driver receives the column active signal for activating a selected column.

7. The semiconductor memory apparatus of claim 6,
 wherein the column active signal has a same phase as a data input clock pulse.

8. The semiconductor memory apparatus of claim 5,
 wherein the synchronous delay circuit unit comprises a pulse generator receiving the column active signal as an input signal.

9. The semiconductor memory apparatus of claim 5,
 wherein the write driver includes:
 a data input unit that receives the data loaded to the input/output line and provides an output signal;
 a selecting unit that determines driving of the write driver; and
 a buffering unit that buffers the output signal of the data input unit.

10. The semiconductor memory apparatus of claim 5,
 wherein the data input/output member includes:
 a pipe register that aligns data stored in a plurality of memory cells;
 a data aligner that aligns data input from outside of the semiconductor memory apparatus in response to the data input clock pulse; and
 a data input/output buffer that exchanges the data with an external apparatus and supplies the data to the data aligner.

11. A semiconductor memory apparatus comprising:
 an address buffer that receives a data input clock pulse after a predetermined time which starts when a clock signal including a write command is generated and supplies a row active signal and a column active signal to a plurality of banks;
 a data input/output member that inputs data to an input/output line in response to the data input clock pulse;
 a write driver that receives the data input to the input/output line; and
 a pulse generator that generates an enable signal that determines a timing of when supplying the data input to the input/output line to the write driver,
 wherein the pulse generator receives the column active signal, and the enable signal is generated in syncronization with a falling edge of the column active signal.

12. The semiconductor memory apparatus of claim 11,
 wherein the data input/output member includes:
 a pipe register that aligns data stored in a plurality of memory cells that constitute each of the banks;
 a data aligner that aligns data input from outside of the semiconductor memory apparatus in response to the data input clock pulse; and
 a data input/output buffer that exchanges data with an external apparatus and supplies the data to the data aligner.

* * * * *